United States Patent
Chang

[19]

[11] Patent Number: 5,907,254
[45] Date of Patent: May 25, 1999

[54] RESHAPING PERIODIC WAVEFORMS TO A SELECTED DUTY CYCLE

[76] Inventor: Theodore H. Chang, 4156 Hubbartt Dr., Palo Alto, Calif. 94306

[21] Appl. No.: 08/597,090

[22] Filed: Feb. 5, 1996

[51] Int. Cl.⁶ ........................................... H03K 3/84
[52] U.S. Cl. .................... 327/165; 327/172; 327/175; 327/291
[58] Field of Search ..................... 327/165, 166, 327/167, 171, 172, 173, 175, 291, 292

[56] References Cited

U.S. PATENT DOCUMENTS

| | | | |
|---|---|---|---|
| 4,549,131 | 10/1985 | Kusazaki | 323/354 |
| 4,568,961 | 2/1986 | Noto | 357/45 |
| 4,596,954 | 6/1986 | Haque | 327/175 |
| 4,638,255 | 1/1987 | Penney | 327/175 |
| 4,750,026 | 6/1988 | Kuninobu et al. | 357/42 |
| 5,057,702 | 10/1991 | Kitagawa et al. | 327/175 |
| 5,185,283 | 2/1993 | Fukui et al. | 437/51 |
| 5,436,583 | 7/1995 | Fujii et al. | 327/165 |
| 5,477,180 | 12/1995 | Chen | 327/175 |

FOREIGN PATENT DOCUMENTS

| | | | |
|---|---|---|---|
| 0 339 534 | 11/1989 | European Pat. Off. | H01L 23/52 |
| 54-32085 | 9/1979 | Japan | H01L 27/04 |
| 3-270268 | 12/1991 | Japan | H01L 27/118 |

*Primary Examiner*—Timothy P. Callahan
*Assistant Examiner*—Jung Ho Kim

[57] ABSTRACT

The invention provides a method and system for reshaping periodic waveforms to a selected duty cycle. An incoming periodic waveform has its edge transitions stretched out, and the stretched edge transitions compared with an adaptively selected threshold, to generate a reshaped waveform with a 50% duty cycle. The incoming periodic waveform is a square wave clock signal. The edge transitions are stretched using an inverter which is biased and filtered, and the stretched edge transitions are squared off using a comparator. The reference voltage for the comparator is selected using a second filter coupled in a feedback configuration with the biasing transistors for the inverter.

15 Claims, 4 Drawing Sheets

5,907,254

RESHAPING PERIODIC WAVEFORMS TO A SELECTED DUTY CYCLE

BACKGROUND OF INVENTION

1. Field of the Invention

This invention relates to reshaping periodic waveforms to a selected duty cycle.

2. Description of Related Art

Clock signals are regularly timed periodic signals which are used to trigger elements in virtually all digital circuits. A typical clock signal is a square wave, i.e., a signal which is virtually always at either a logic "0" value or a logic "1" value, with sharply defined edges at transition times. For example, storing data into a register might be triggered by the rising edge of the clock signal, i.e., the transition from logic "0" to logic "1". A clock signal is often described in terms of its frequency, which is the number of full periods of the clock signal in a second, and its duty cycle, which is the fraction of each full period the clock signal spends at logic "1". The clock signal may also be described by the duty cycle skew, which is the difference between the fraction of each full period the clock signal spends at logic "1" and the fraction it spends at logic "0". An equivalent to frequency is the clock signals period or width, which is the duration in seconds of one full period.

Many digital circuits are "edge-triggered", i.e., triggered by an edge of the clock signal, and of those, many digital circuits have both elements which are triggered by the rising edge of the clock signal and elements which are triggered by the falling edge of the clock signal. Moreover, many digital circuits have signal paths which are time-critical; they depend on the clock signal's width being longer than some preselected time value. In such digital circuits, it can be critical that the duty cycle of the clock signal is exactly 50%. For example, if the clock signal has a frequency of 100 megahertz and therefore a period of 10 nanoseconds, circuits which require a time period of at least 4.9 nanoseconds will fail if the duty cycle varies outside the range 49% to 51%. Many digital circuits have even more stringent tolerances.

One known method is to start with a clock signal which is twice as fast, to couple the "doubled" clock signal to a divide-by-two counter, or to use a phase-locked loop (PLL) to generate a new clock signal which has about a 50% duty cycle. While this method is capable of achieving an approximately 50% duty cycle, it is not suitable when digital circuit tolerances are very stringent. Moreover, it often requires generating a clock signal which is at a higher frequency than can be stably achieved.

Accordingly, it would be advantageous to provide a superior technique for reshaping periodic waveforms to a selected duty cycle. The preferred selected duty cycle is 50%, but the same technique is capable of reshaping periodic waveforms to any selected duty cycle, such as 1%, 10%, 33⅓%, or some other selected duty cycle.

SUMMARY OF THE INVENTION

The invention provides a method and system for reshaping periodic waveforms to a selected duty cycle. In a preferred embodiment, an incoming waveform has its edge transitions stretched out, and the stretched edge transitions compared with an adaptively selected threshold, to generate a reshaped waveform with a duty cycle exactly equal to a selected value, preferably a 50% duty cycle.

In a preferred embodiment, the incoming waveform is a square wave clock signal. The edge transitions are stretched using an inverter which is biased and filtered, and the stretched edge transitions are squared off using a voltage comparator. The reference voltage for the voltage comparator is selected using a second filter coupled in a feedback configuration with the biasing transistors for the inverter.

DESCRIPTION OF THE PREFERRED EMBODIMENTS

Figure 1:
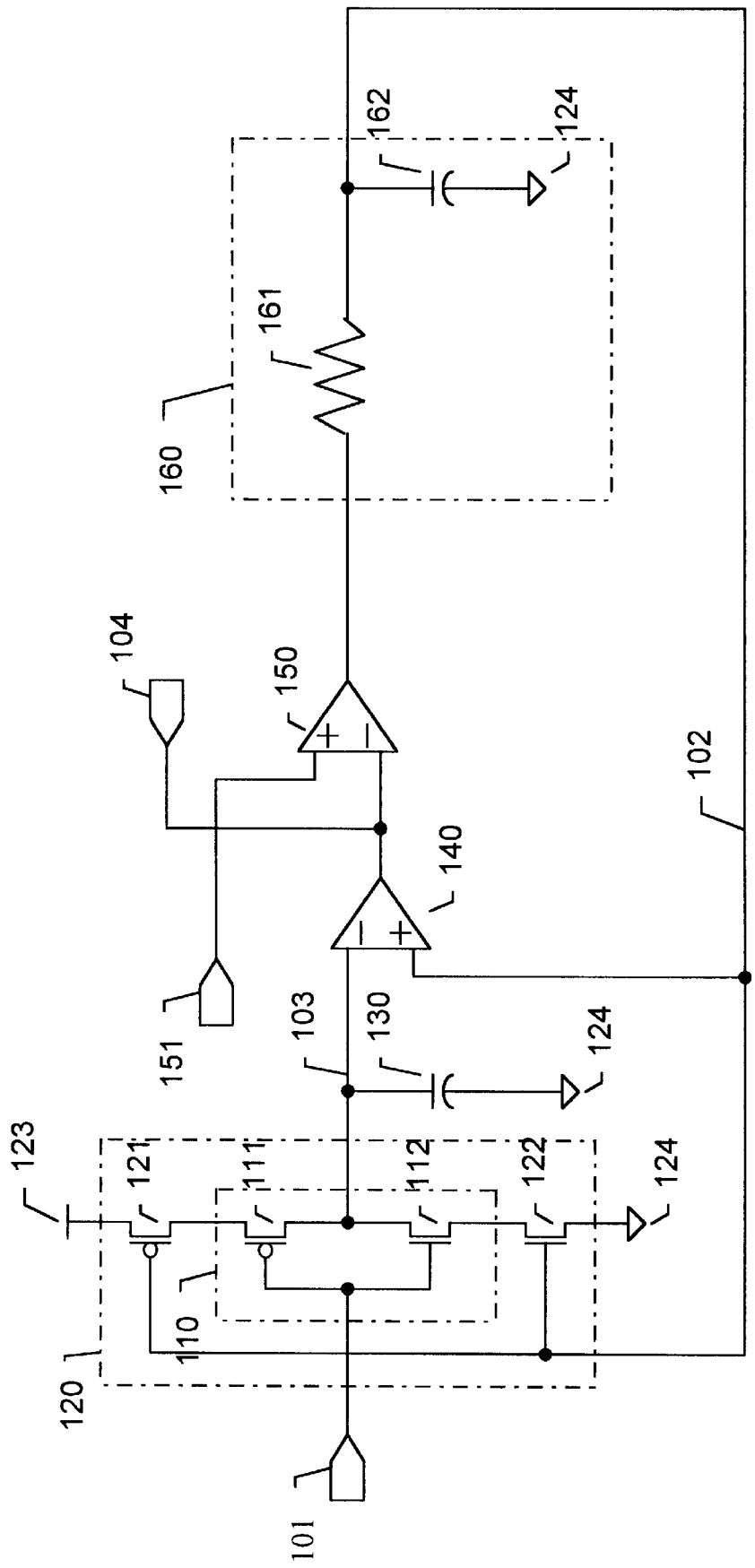
FIG. 1 is a block diagram of a first circuit for re-shaping periodic waveforms to a selected duty cycle.

FIG. 1 is a block diagram of a first circuit for re-shaping periodic waveforms to a selected duty cycle.

In a circuit 100, an incoming clock signal is coupled to an incoming node 101. The incoming node 101 is coupled to an inverter 110, which comprises two transistors 111 and 112, coupled in a known configuration for an inverter. The incoming node 101 is coupled to the gate of transistor 111 and the gate of transistor 112. The inverter 110 is biased by a biasing circuit 120, which comprises two transistors 121 and 122, coupled in a known configuration for a biasing circuit, with a source for the transistor 121 coupled to $V_{cc}$ 123 and a drain for the transistor 122 coupled to ground 124.

The gate of transistor 121 and the gate of transistor 122 are coupled to a feedback node 102.

The output of the inverter 110 is coupled to a node 103, which is coupled through a capacitor 130 to ground 124.

The node 103 is also coupled to the negative input of a first voltage comparator 140. The positive input of the first voltage comparator 140 is coupled to the feedback node 102.

The output of the first voltage comparator 140 is coupled to an output node 104.

The output of the first voltage comparator 140 is also coupled to the negative input of a second voltage comparator 150. The positive input of the second voltage comparator 150 is coupled to a threshold voltage 151.

The threshold voltage 151 provides a reference point at which the 50% duty cycle is measured. When the output signal at the node 104 crosses the threshold voltage 151, that event defines an edge transition for the output signal. Thus, the signal at the output node 104 will exceed the threshold voltage 151 during exactly 50% of its period. If the circuit is used to generate an output signal with a different selected duty cycle, such as 33⅓%, the signal at the output node 104 will exceed the threshold voltage 151 for exactly that selected duty cycle as a fraction of its period.

In a first preferred embodiment, the 50% duty cycle is for a TTL logic signal and the threshold voltage 151 is a TTL threshold voltage such as 1.5 volts (preferably, some voltage between about 0.8 volts and about 2.0 volts). In this first preferred embodiment, the second voltage comparator 150 comprises a TTL buffer.

In a second preferred embodiment, the 50% duty cycle is for a CMOS logic signal and the threshold voltage 151 is a CMOS threshold voltage, such as 2.5 volts. In this second preferred embodiment, the second voltage comparator 150 comprises a CMOS inverter.

In alternative embodiments, the 50% duty cycle may be intended for use by another logic family, such as ECL, BTL, or another logic family, and the threshold voltage 151 is selected for the desired logic family. In other alternative embodiments, the threshold voltage 151 may be any other selected voltage, for example, +1.0 volts.

The output of the second voltage comparator 150 is coupled to a low pass filter 160, comprising a resistor 161 and a capacitor 162, coupled in a known configuration for a low-pass filter. The output of the low pass filter 160 is coupled to the feedback node 102.

Figure 2:
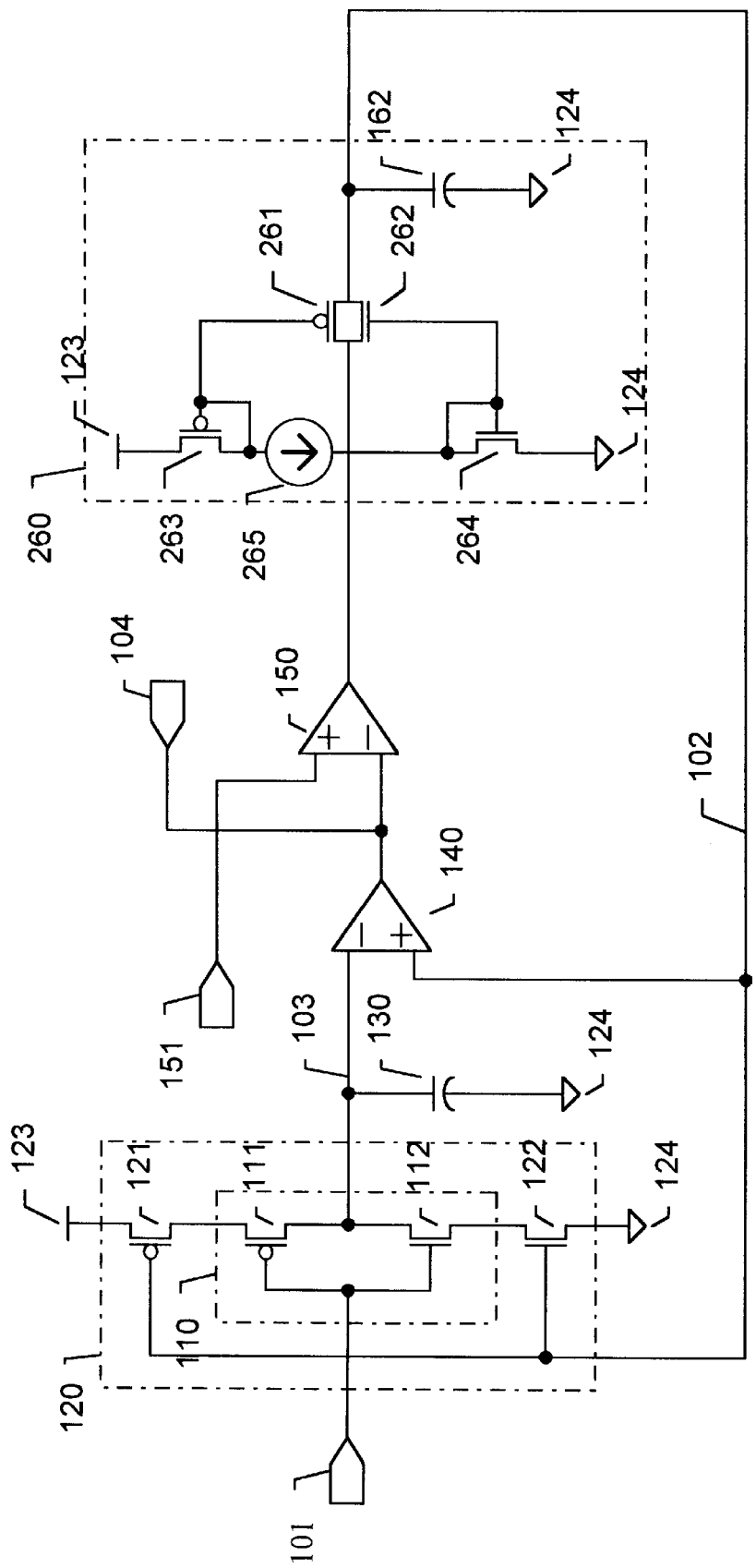
FIG. 2 is a block diagram of a second circuit for re-shaping periodic waveforms to a selected duty cycle.

FIG. 2 is a block diagram of a second circuit for re-shaping periodic waveforms to a selected duty cycle.

A circuit 200 is similar to the circuit 100 and operates in a similar manner. However, in the circuit 200, filter 260 has been modified from filter 160, and now resistor 161 comprises a biased transistor pair having a transistor 261 and a transistor 262, coupled in a known configuration for a biased transistor pair, so as to produce the effect of a high-value resistor with an implied current of about 48 microamps. The biased transistor pair is biased by a biasing circuit comprising a transistor 263, a transistor 264, and a current source 265, coupled between the voltage $V_{dd}$ 123 and ground 124 in a known configuration for a biasing circuit.

In a preferred embodiment, the current source 265 is implemented using a resistor. The current source 265 controls the time constant of the filter 260. The time constant of the filter 260 should be large enough, relative to the period of the incoming clock signal at the incoming node 101, so the reference voltage at the node 102 is relatively constant like a DC level signal.

Figure 3:
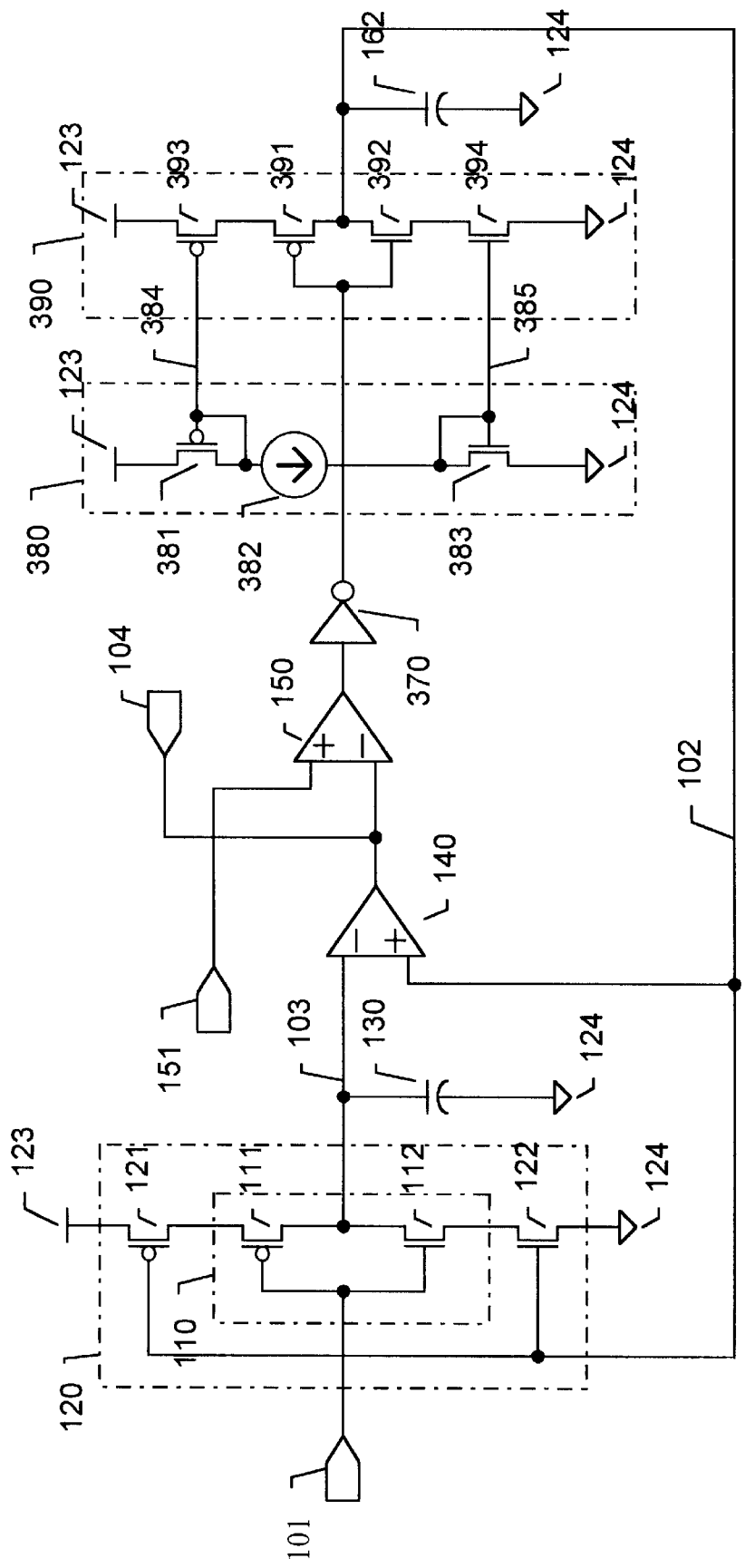
FIG. 3 is a block diagram of a third circuit for re-shaping periodic waveforms to a selected duty cycle.

FIG. 3 is a block diagram of a third circuit for re-shaping periodic waveforms to a selected duty cycle.

A circuit 300 is similar to the circuit 100 and operates in a similar manner. However, in the circuit 300, the resistor 161 is replaced with an inverter 370, coupled in series with a biasing circuit 380 and a biased inverter 390.

The biasing circuit 380 comprises a transistor 381, a current source 382, and a transistor 383, coupled in series between the voltage $V_{dd}$ 123 and ground 124 in a known configuration for a biasing circuit. The biasing circuit 380 has an output 384 coupled to the transistor 381 and an output 385 coupled to the transistor 383.

In a preferred embodiment, the current source 382 is implemented using a resistor. Similar to the current source 265, the current source 382 controls the time constant of the filter comprising the biased inverter 390 and the capacitor 162. Similar to the filter 160, the time constant of this filter should be large enough, relative to the period of the incoming clock signal at the incoming node 101, so the reference voltage at the node 102 is relatively constant like a DC level signal.

The biased inverter 390 comprises a transistor 391 and a transistor 392, coupled in a known configuration for an inverter, and a transistor 393 coupled to the output 384 and a transistor 394 coupled to the output 385, coupled between the voltage $V_{dd}$ 123 and ground 124 in a known configuration for biasing the inverter. The output of the inverter is coupled to the feedback node 102.

The biasing circuit 380 and the biased inverter 390 combine with the capacitor 162 to select a voltage at the node 102 which causes the output signal at the node 104 to have a duty cycle other than 50%. The ratio R=H/L of signal-high time H to signal-low time L, in each period of the output signal at the node 104, is shown by equation 395.

$$R = \frac{M4S}{M3S} = \frac{M2S}{M1S} \qquad (395)$$

where M1S is the size of the transistor 381,
M2S is the size of the transistor 393,
M3S is the size of the transistor 383, and
M4S is the size of the transistor 394.

Figure 4:
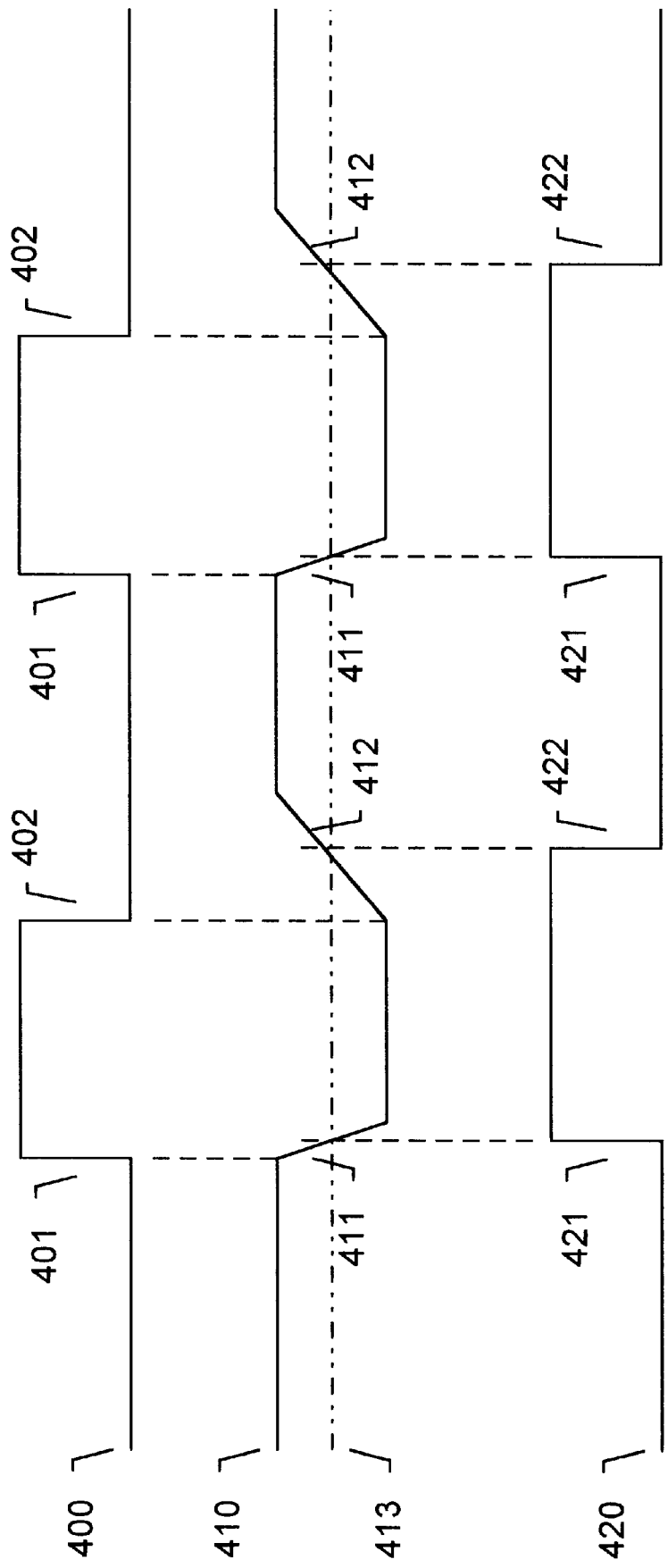
FIG. 4 is a timing diagram of signals in the circuits for re-shaping periodic waveforms to a selected duty cycle.

FIG. 4 is a timing diagram of signals in the circuits for re-shaping periodic waveforms to a selected duty cycle.

An incoming clock signal 400 appears at the incoming node 101. The incoming clock signal 400 comprises a square wave clock signal with a rising edge 401 and a falling edge 402, and typically has other than a 50% duty cycle.

The inverter 110 and the biasing circuit 120 operate to invert the incoming clock signal 400 and simultaneously stretch the rising edge 401 and the falling edge 402 for the incoming clock signal 400, so as to produce a stretched signal 410 with a stretched falling edge 411 and a stretched rising edge 412.

The first voltage comparator 140 operates to square off the stretched falling edge 411 and the stretched rising edge 412, by comparing them with a reference voltage 413, which is equal to the voltage at the output of the low pass filter 160 at the feed-back node 102. The low pass filter 160 operates to produce a DC level control signal whose voltage level is responsive to the duty cycle of the stretched signal 410.

Thus, the output of the first voltage comparator 140, at the output node 104, is an output signal 420 with a rising edge 421 and a falling edge 422, whose duty cycle is 50%.

In the illustrated example, the incoming clock signal 400 has a duty cycle of about 30%.

The stretched signal 410 has a stretched falling edge 411 which follows the original rising edge 401 for a time, and a stretched rising edge 412 which follows the original falling edge 402 for a time. The reference voltage 413 (the voltage at the feedback node 102) is exceeded partway through the stretched falling edge 411 and is exceeded partway through the stretched rising edge 412.

The first voltage comparator 140 squares off the stretched signal 410 and thus generates the output rising edge 421 and the output falling edge 422 of the output signal 420. The output rising edge 421 is therefore delayed from the input rising edge 401, and the output falling edge is delayed from the input falling edge 402.

The reference voltage 413 (the voltage at the feedback node 102) varies responsive to the duty cycle of the incoming clock signal 400, and controls the amount of delay from the input rising edge 401 to the output rising edge 402, and from the input falling edge 401 to the output falling edge 402. If the duty cycle skew of the incoming clock signal 400 is larger, the reference voltage 413 at the feedback node 102 causes greater delays, and if the duty cycle skew of the incoming clock signal 400 is smaller, the reference voltage 413 at the feedback node 102 causes smaller delays, so that the duty cycle of the output signal 420 will always be exactly 50%.

Operation of the circuit 300 is similar to the circuit 100. However, the circuit 300 generates the reference voltage 413 at the feedback node 102 so that the duty cycle of the output signal 420 will be a selected value other than exactly 50%, for example 33⅓%. The selected value is determined by the choice of component values as described herein, for example, by the choice of M1S, M2S, M3S, and M4S, as described with regard to equation 395.

Alternative Embodiments

Although preferred embodiments are disclosed herein, many variations are possible which remain within the concept, scope, and spirit of the invention, and these variations would become clear to those skilled in the art after perusal of this application.

I claim:

1. A system for reshaping periodic waveforms to a selected duty cycle, said system comprising means for receiving an incoming waveform, said incoming waveform having a set of edge transitions;

means for stretching said edge transitions to produce a set of stretched edge transitions;

means for comparing said stretched edge transitions with a variable threshold, whereby said means for comparing generates a reshaped waveform with a duty cycle exactly equal to a selected value; and wherein said means for comparing comprises an input coupled to the variable threshold, said variable threshold being selected using a filter coupled in a feedback configuration with said means for stretching.

2. A system as in claim 1, wherein said incoming waveform comprises a square wave clock signal.

3. A system as in claim 1, wherein said means for stretching comprises a filter.

4. A system as in claim 1, wherein said means for stretching comprises an inverter.

5. A system as in claim 4, wherein said inverter in said means for stretching is biased.

6. A system for reshaping periodic waveforms to a selected duty cycle, said system comprising means for receiving an incoming waveform, said incoming waveform having a set of edge transitions;

means for stretching said edge transitions to produce a set of stretched edge transitions;

means for comparing said stretched edge transitions with a variable threshold, whereby said means for comparing generates a reshaped waveform with a duty cycle exactly equal to a selected value; and wherein said means for stretching comprises an inverter coupled to means for biasing said inverter;

said means for receiving is coupled to an input for said inverter;

said inverter is coupled to a first filter;

said means for comparing is coupled to a second filter; and said second filter is coupled to said means for biasing.

7. A system for re-shaping periodic waveforms to a selected duty cycle, said system comprising means for receiving an incoming waveform, said incoming waveform having a set of edge transitions, said means for receiving is coupled to a gate node for said second and a gate node for said third transistor;

means for stretching said edge transitions to produce a set of stretched edge transitions, said means for stretching comprises first, second, third and fourth transistors coupled between a voltage source and a voltage drain;

means for comparing said stretched edge transitions with a variable threshold responsive to said incoming waveform, whereby said means for comparing generates a reshaped waveform with a duty cycle exactly equal to a selected value, and wherein said variable threshold is substantially DC in nature, said means for comparing is coupled to said comparator;

and said comparator is coupled to a gate node for said first and a gate node for said fourth transistor.

8. A system as in claim 1, comprising means for comparing said reshaped waveform with a selected threshold voltage.

9. A system as in claim 1, comprising means for selecting said variable threshold.

10. A system as in claim 9, wherein said means for selecting comprises a filter.

11. A system as in claim 9, wherein said means for selecting comprises a biasing circuit, whereby said means for selecting selects said variable threshold in response to a duty cycle ratio selected by said biasing circuit.

12. A system as in claim 1, wherein said selected value is a 50% duty cycle.

13. A system for reshaping waveforms to a selected duty cycle, said system comprising a biased inverter having an input having means for receiving an incoming waveform;

a filter coupled to an output of said biased inverter;

a comparator coupled to an output of said filter; and a biasing circuit coupled to an output of said comparator and coupled to both an input of said comparator and said biased inverter.

14. A system for reshaping waveforms to a selected duty cycle comprising a biased inverter having an input having means for receiving an incoming waveform;

a filter coupled to an output of said biased inverter;

a first comparator coupled to an output of said filter;

a second comparator coupled to an output of said first comparator, said second comparator having an input coupled to a threshold voltage; and a biasing circuit, an input of which coupled to an output of said second comparator, an output of which is coupled to both an input of said first comparator and said biased inverter.

15. A system as in claim 13, comprising a filter coupled to an output of said comparator, an output of said filter being coupled to said biasing circuit.

* * * * *